United States Patent [19]

Tomita et al.

[11] 4,122,386

[45] Oct. 24, 1978

[54] UNIFORM MAGNETIC FIELD GENERATING DEVICE

[75] Inventors: Sadami Tomita, Katsuta; Akio Chiba, Hitachi; Yoshiharu Utsumi, Katsuta, all of Japan

[73] Assignee: Hitachi, Ltd., Japan

[21] Appl. No.: 683,280

[22] Filed: May 5, 1976

[30] Foreign Application Priority Data

May 12, 1975 [JP] Japan ................................ 50-54577

[51] Int. Cl.[2] ............................................ G01R 33/08

[52] U.S. Cl. ............................. 324/0.5 H; 324/0.5 R

[58] Field of Search ................. 324/13, 151 R, 151 A, 324/37 R, 0.5 MA, 0.5 H

[56] References Cited

U.S. PATENT DOCUMENTS

| | | | |
|---|---|---|---|
| 2,394,724 | 2/1946 | Snorek | 324/151 R |
| 2,833,989 | 5/1958 | Nylander | 324/151 R |
| 3,030,556 | 4/1962 | Watson | 324/0.5 H |
| 3,535,619 | 10/1970 | Franz et al. | 324/13 |

*Primary Examiner*—M. Tokar

*Attorney, Agent, or Firm*—Craig & Antonelli

[57] ABSTRACT

A uniform magnetic field generating device for generating a uniform magnetic field such as that required in a nuclear magnetic resonance device is disclosed. In prior art devices, in order to obtain a highly uniform magnetic field space, a parallel gap has been formed between pole pieces which were magnetically homogenized and mounted on magnets coupled by a yoke. In place of such pole pieces, a magnetically homogenized pole block or a pole block sandwiched by pole pieces is inserted between the magnets and a cylindrical hole or space is formed in the pole block, a sectional area of the space taken in parallel with the direction of a magnetic field due to the magnets and perpendicular to the axial line of the space being of circular, ellipse or rectangular shape, whereby a highly uniform magnetic field space is established.

33 Claims, 7 Drawing Figures

UNIFORM MAGNETIC FIELD GENERATING DEVICE

BACKGROUND OF THE INVENTION

1. Field of the Invention

The present invention relates to a magnetic field device for generating an extremely highly uniform magnetic field, and more particularly to a uniform magnetic field device particularly adapted to obtain a high resolution power in a nuclear magnetic resonance device.

2. Description of the Prior Art

As it is considered that the present invention can be readily understood by explaining the case where the present invention is applied to a nuclear magnetic resonance analyzer, for example, a principle of the nuclear magnetic resonance analyzer will be first explained briefly in conjunction with FIG. 1. A material sample 12 to be analyzed is placed between a pair of magnets 1*a* and 1*b* which establish an extremely strong and uniform, unidirectional polarized magnetic field. Applied further to the material sample 12 is a radio-frequency magnetic field generated by a radio-frequency oscillator 13 and a radio-frequency coil 14, which radio-frequency magnetic field is applied normally to the unidirectional, polarized magnetic field so that through a precise and proper combination of those two magnetic fields, the nuclei of the sample are caused to produce magnetic resonance absorption to generate an electric signal, which is then detected and displayed by a detection-display device 15. In this manner, molecule structure of the material sample or the like can be analyzed.

Furthermore, a great deal of information, both qualitative and quantative, for the chemical and physical properties of the sample under study can be derived from the magnetic resonance absorption signal. As technology advances, a requirement of higher resolution power occurs. To accomplish such a high resolution power, it is important that the sample is placed in a uniform strength magnetic field. Thus, many efforts have been made with various devices to obtain a uniform magnetic field. In general, great attention has been paid to a winding of a strong electromagnet for generating a magnetic field, provision of magnet poles of the material and proper alignment of the magnet poles on a coil structure.

For example, a space field gap required in the magnetic resonance analyzer is in the order of 10 mm but a variation rate of a space magnetic field distribution at a magnetic field strength of several thousands oersteds (Oe) or more should be less than 0.01%. In the past, as a polarized magnetic field generator of this type, as shown in FIG. 2, a parallel gap 3 defined by magnets 1*a* and 1*b* and magnetically homogenized pole pieces 2*a* and 2*b* has been used to generate a space magnetic field between the parallel gap 3. However, from a standpoint of obtaining a highly uniform magnetic field, it has a drawback in that larger magnets are required relative to magneto-motive force required when the parallel gap is used. Furthermore, there exists a difficulty in strictly tailoring the parallelism of the gap in order to generate a uniform magnetic field. The strength of the magnetic field required in the magnetic resonance analyzer is more than 10,000 Oe and the prior art magnets which used the parallel gap required a magnetic device which amounted to more than 2 tons in weight to attain such strength. Therefore it was a serious problem to maintain efficiently the magnetic field strength in the parallel gap. Furthermore, the generation of a uniform magnetic field in the parallel gap induced complex mechanism in the prior art magnetic resonance device and many unstable factors due to external factors such as temperature and external disturbance magnetic fields. As a result, great effort and care has had to be paid to maintenance. Even after such troublesome arrangements, the magnetic field might become nonuniform during transportation of the device or by external vibration and hence readjustment has been frequently required.

SUMMARY OF THE INVENTION

It is, therefore, an object of the present invention to provide a novel device for generating a magnetic field of higher strength and more uniform than could be attained by the prior art device, and to provide a polarizing magnetic field generating device which is smaller in size than the prior art device and which is simpler in construction and requires less complex structure than the prior art device using a parallel gap in which mechanical structure for adjusting the parallelism is required.

The uniform, polarized magnetic field generating device of the present invention is characterized by that, as shown in FIG. 3, magnetic flux generated in a sample space 6 formed in a pole block 5 is established under the condition of uniform magnetization of the pole block. The sample space is constructed such that at least one end is open to allow the insertion of a sample, and the remaining portions are enclosed by ferromagnetic material to define an air gap. A uniform magnetic field generated in the air gap is used as the polarized magnetic field for the magnetic resonance.

A principle of a magnetic field in the sample space will first be explained.

A magnetic field H in the sample space formed within the pole block is the sum of a magnetic field $H_p$ produced by magnet poles generated on the surface of the sample space and an effective magnetic field $H_o$ applied to the pole block. It is thus represented that $H = H_p + H_o$. Here, $H_p$ is determined by the magnetization of the pole block $4\pi\vec{I}$ and the contour of the sample space. For simplification, assuming that the magnetization of the pole block as well as the periphery of the sample space is uniform, it can be represented as follows:

$$H_p = \int_s (1/r2) ds,$$

where $r$ is a distance from any given point $p$ in the sample space or hole to the surface of the sample space and integration symbol $\int_s$ stands for whole integration of the surface of the sample space. The integrated field $H_p$ depends on the contour of the sample space, and when the sample space has an contour of an ellipse base cylinder, perfectly uniform magnetic field is established at any point in the sample space. In order to establish a highly uniform magnetic field, it is important to make the magnetization $\vec{I}$ in the vicinity of the sample space uniform. It has been found that the magnetic flux distribution in the sample space depends on the dimension and contour of the sample space, the shape of the entire magnet forming a magnetic circuit and the amount of magnetization. The inventors conducted experiments on various contours and dimensions of the sample space as well as various contours and dimensions of the ferromagnetic material (the portion for generating the space magnetic field) and found that the space magnetic field having almost theoretical magnetic field strength and high uniformity could be obtained: 1) by forming the sample space into an ellipse base cylinder a sectional area of which taken in parallel to the direction of magnetic field and perpendicular to the axial line is of an ellipse shape with a diameter of the ellipse in the direction of the magnetic field being smaller than a diameter in the transverse direction thereto, 2) by setting a ratio of the sectional area of the sample space to a sectional area of the ferromagnetic material in a plane perpendicular to the magnetic flux passing through the sample space, to be smaller than ⅓, 3) by designing the sample space to be symmetrical about the center plane in the direction of magnetic flux and to have eccentricity error from a geometrical pattern less than 1/1000, 4) by constructing the pole block to have a smallest sectional area at the center between the magnets and to have the sample space at the minimum sectional area portion, or 5) designing the pole block to have a magnetic flux variation rate in the sample space of less than 0.01% at the magnetized state of more than 95% of the saturation magnetic flux density, or by combination of two or more of the above. Furthermore, since the non-uniformity of the space magnetic field due to the imperfection of the uniform magnetization can be compensated for by mechanical shim or current shim, further higher uniform magnetic field can be derived by combining those compensation mechanisms, and it has been found that the present invention is extremely effective in the space magnetic field device such as a nuclear magnetic resonance device which requires a magnetic flux variation rate of less than 0.01%.

The sample space may or may not have a through-hole in the pole block and the through-hole, if any, may be perpendicular or oblique to the direction of the magnetic flux in the pole block. The sectional area at the insertion port of the sample space may be of circular, elliptical or of rectangular shape. An elliptical shape is preferable. The longitudinal shape of the sample space is preferably of an elliptical base cylinder which is an extension of the sectional area at the insertion port.

The cross sectional area of the sample space in a plane normal to the magnetic flux should be smaller than the sectional area of that portion of the pole block which defines the sample space in order to assure greater magnetic field strength than that obtainable by the prior art parallel gap formed by and between the pole pieces, and the former sectional area is preferably less than ⅓ of the latter sectional area in order to obtain a more uniform magnetic field. The former sectional area is also preferably less than ⅓ of the latter sectional area in order to reduce the influence of external fields and make the influence uniform.

It is desirable that the sample space is symmetrical about the control plane thereof peripendicular to the direction of the magnetic flux in order to make the magnetic field strength in the space uniform. It is also desirable to limit the eccentricity error from the geometrical pattern to less than 1/1000 in order to establish a uniform magnetic field.

By forming the sample space at the position of minimum sectional area of the pole block, the magnetic field strength can be increased. Particularly, the minimum sectional area portion of the pole block is positioned at the center between the magnets, and the sample space is formed thereat. The pole block may be of hand drum shape which has a minimum sectional area at the center between the magnets. The pole block is made of magnetic material and homogenized Fe — Co Permendur alloy may be advantageously used. The magnetic flux variation rate can be limited to less than 0.01% by selecting the saturation magnetic flux density to be higher than 22 kG and by maintaining a magnetization state of higher than 95% of the saturation magnetic flux density. As the magnetic material which meets the above requirement, Fe — Co Permendur alloy may be advantageously used, which can establish a uniform space magnetic field.

The pole block is advantageous to reduce the magnetic field variation rate when it is made of at least two magnetically homogenized ferromagnetic materials having different magnetic properties and inserted in the magnetic circuit. As a result, the space magnetic field variation rate can be materially reduced. One example of the material is so called Permendur alloy consisting of Fe — 40% Co. The contour of the pole block may be of cylindrical or rectangular shape, or preferably of hand drum shape which has a minimum sectional area at the center between the opposite ends in the direction of the magnetic flux in order to attain a particularly high magnetic flux density.

As stated above, the uniform magnetic field generating device of the present invention which is based on the principle of the space magnetic field is characterized by requiring a magnetic device of relatively small magnetomotive force section relative to the volume of the uniform space of the magnetic field. This can be realized by using materials of appropriate magnetic properties at respective portions of the magnetic circuit and forming the magnetic circuit into a closed type. This is further assured by using Fe — Co magnetic alloy having a high saturation magnetic flux density as the magnetic material surrounding the sample space. Namely, assuming that magnetomotive force supplied to the magnetic circuit is 1050 Oe·cm and motive force of magnetic flux consumed by the yoke is 5% (corresponding to a yoke having length of 50 cm and permeability $\mu$ of 1000), the magnetic field strength in the prior art parallel gap (having the width of 1 cm) is calculated by a simple method to be 1000 Oe while the magnetic field strength in the present invention is substantially higher, i.e. 8750 Oe when Fe — Co Permendur alloy (having a permeability $\mu$ of 100) is used as the pole block 5 shown in FIG. 3 and the magnetic field strength H of the sample space (which is a through-hole having a diameter of 1 cm) is calculated from the relation of $H = N \cdot B$ where N is a demagnetization coefficient which is equal to 0.5 (when the hole is of cylinder shape). Therefore, according to the present invention, only about one ninth of the length of magnet material is required to attain the same magnetic field strength at the air gap as that of the prior art device having the same sectional area contour. Thus, the size of the magnet device can be reduced. Further, the prior art parallel gap type device has required a highly precise adjustment mechanism to obtain a highly uniform magnetic field and even after such adjustment the alignment might be disturbed during transportation of the device such that readjustment was required. On the other hand, the pole block with space therein in accordance with the present invention assures a magnetic field variation rate of less than 0.01%, requires minimum adjustment, produces no shift due to subsequent mechanical vibration, eliminates the need of complex mechanical elements for preventing the variation of the magnetic field at the air gap, and allows a simple structure.

DESCRIPTION OF THE PREFERRED EMBODIMENTS

Embodiment 1

Figure 3:
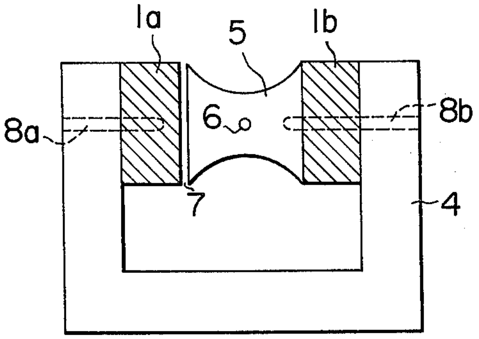
FIGS. 3 to 6 show constructions of uniform, polarized magnetic field generating devices in accordance with the embodiments of the present invention.

An embodiment of the magnet device of the present invention is shown in FIG. 3.

The pole block 5 was fixed by the permanent magnets 1*a* and 1*b* having large residual magnetic flux density and energy product and the yoke 4 of high permeability material and bolts 8*a* and 8*b*. In this manner, the permanent magnets 1*a* and 1*b* and the yoke 4 constituted a substantially closed magnetic circuit of the magnetic device except the space 7 of about 0.2 mm width between the pole block 5 and the permanent magnet 1*a*. The intention of the provision of the space 7 is to allow the expansion and contraction of the material during magnetization and demagnetization thereof. The pole block 5 was of hand drum shape having reduced area at the center thereof at which a sample space 6 was formed.

Figure 1:
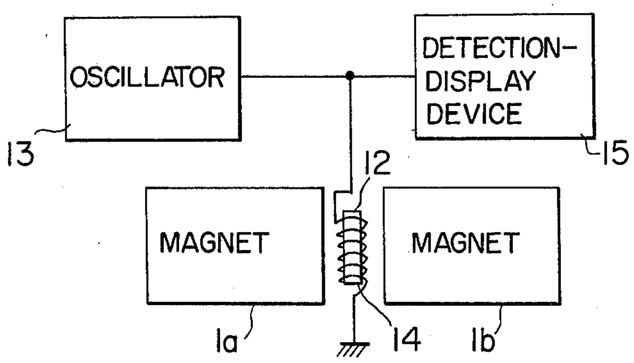
FIG. 1 is a block diagram illustrating a principle of a magnetic resonance analyzer.
Figure 2:
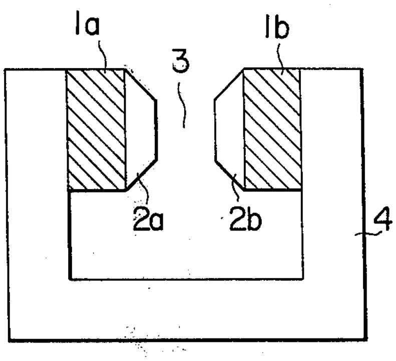
FIG. 2 shows a structure of a polarized magnetic field device of a prior art magnetic resonance analyzer.

The permanent magnets 1*a* and 1*b* were sources of magnetomotive force and they were alnico (Fe — Ni — Al) magnets having sufficient energy products and dimensions to magnetize an entire magnetic circuit. The yoke 4 and the bolts 8*a* and 8*b* were made of electromagnetic soft iron. The pole block 5 was made of Fe — Co alloy magnetic material having high saturation magnetic flux density. The pole block 5 had decreasing sectional area toward the center thereof so that the magnetic field strength $4\pi I$ at the center reached 24,100 Gausses (G). The diameter of the pole block at the center thereof was 40 mm, and a through-hole of circular sectional area having a diameter of 10 mm was formed at the center. After the magnetic path had been established, a coil was wound on the yoke 4 to magnetize the device by D.C. current. By the magnetization, the magnets 1*a* and 1*b* functioned as the magnetomotive force source, by which the pole block was magnetized to establish magnetic field in the sample space 6. The magnetic field strength at the air gap obtainable when the magnet device was magnetized without the pole block as shown in FIG. 1 was 5,650 Oe at the center of the gap (2 cm width). On the other hand, the magnetic field strength in the sample space of the present magnet device with the pole block was 9,650 Oe at the center of the hole. The magnetic field variation rate within the sample space was 0.01%/cm at the center of the hole with a diameter of 5 mm and length of 10 mm. The magnetic field variation rate when the diameter of the hole was 20 mm was 0.025%.

Figure 4:
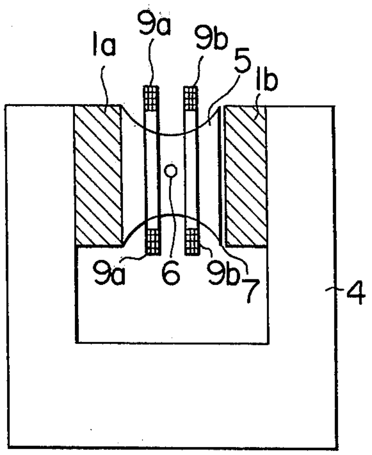

When the magnetic field around the center periphery of the pole block 5 was strengthened by Hermholtz coils 9*a* and 9*b* shown in FIG. 4, the magnetic field variation rate at the center of the sample space 6 was 0.008%/cm.

EMBODIMENT 2

Figure 5:
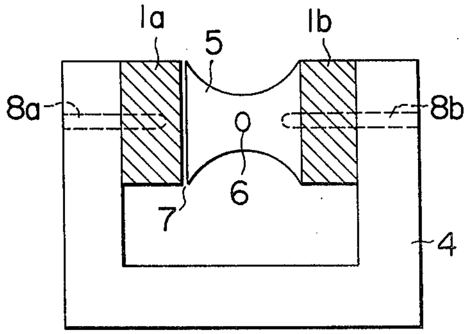

As shown in FIG. 5, the same magnetic circuit as used in the Embodiment 1 was used together with the sample space 6 defined by the pole block 5 having a through-hole a sectional area of which perpendicular to the axial line of the sample space 6 and parallel to the direction of the magnetic field was of elliptical shape with a diameter of 10 mm in the direction of the magnetic field and a diameter of 15 mm in the transverse direction thereto. The magnetic field variation rate at the center of the sample space 6 was measured as 0.008%/cm.

EMBODIMENT 3

Figure 6:
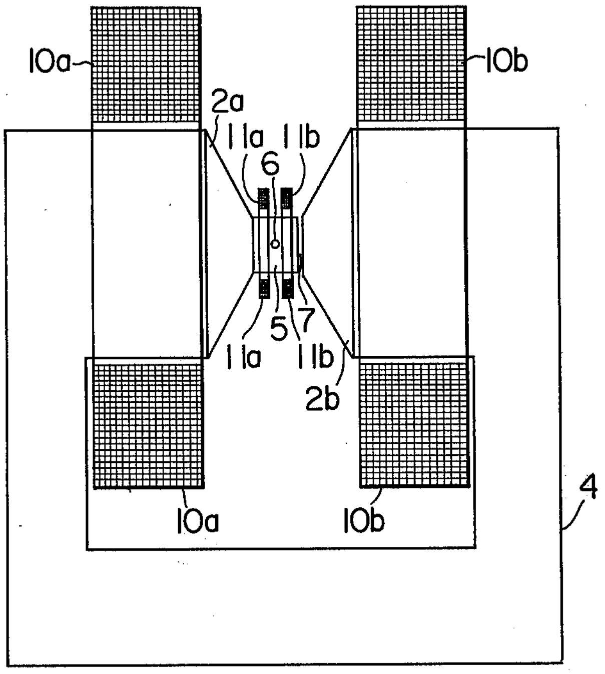

A structure of another embodiment of the magnet device of the present invention is shown in FIG. 6.

Figure 7:
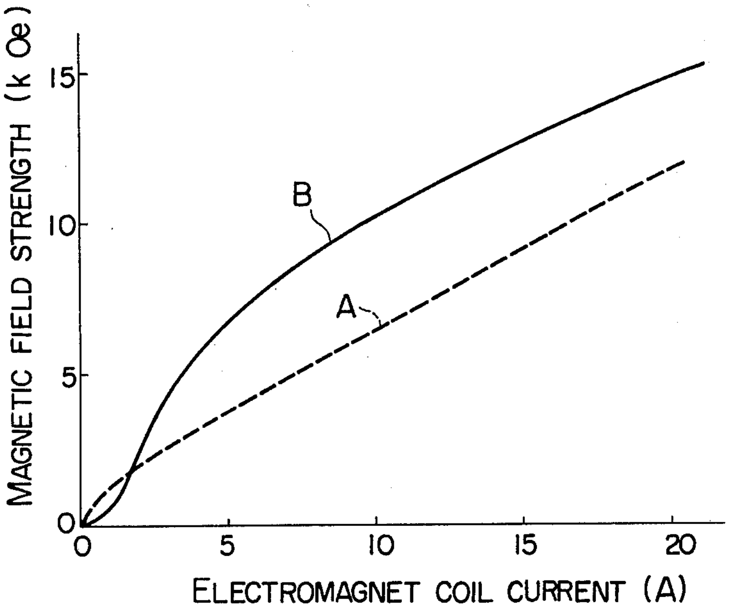
FIG. 7 is a graph showing the relation between an electromagnet coil current and a magnetic field strength measured for the magnetic field generating device of FIG. 6.

The pole block 5 was fixed between the electromagnets 10*a* and 10*b* and the pole pieces 2*a* and 2*b*. The pole pieces had a diameter of 50 mm at their ends and an inclination angle of 60°. The pole block 5 had the diameter of 50 mm and the length of 30 mm, and a through-hole 6 of circular sectional area having a diameter of 10 mm was formed at the center of the pole block. The magnetic field generated when current was passed through the electromagnet coils 10*a* and 10*b* is shown in FIG. 7, in which the curve A shows the magnetic field strength in the pole piece gap (length 1 cm) in the absence of the pole block 5 while the curve B shows the magnetic field strength in the hole formed in the pole block 5. Although the ratio of the magnetic field strength in the sample space to the magnetic field strength in the pole piece gap changes depending on the magnitude of the current passed through the electromagnet coils 10*a* and 10*b*, it has been proved that the space magnetic field in the present invention was larger and showed higher uniformity of the magnetic field at large coil currents. The magnetic field variation rate for the pole piece parallel gap at the coil current of 10A was 0.04%/cm while that for the present pole block hole was 0.01%/cm. When the Hermhortz coils 11*a* and 11*b* were additionally provided externally of the pole block in order to further improve the uniformity of the space magnetic field in the present invention by supplying a conpensation current through the coils, a magnetic field variation rate of 0.002%/cm was measured.

EMBODIMENT 4

The magnetic circuit shown in Embodiment 1 was used. When the eccentricity error of the space forming the sample space from the geometrical pattern was 10 $\mu$, for example, for a circular hole of the sample space having a diameter of 10 mm (eccentricity error 1/1000), the magnetic field variation ratio was 0.01%, which was satisfactory. However, when the eccentricity error exceeded 1/1000, the magnetic field variation rate increased.

EMBODIMENT 5

Using the magnetic circuit shown in the Embodiment 5, the space magnetic field variation rate for the magnetization of the pole block having a through-hole of 10 mm diameter was investigated. It has been found that at 90% of the saturation magnetic flux density, the space magnetic field variation rate was 0.020%, at 95% it was 0.008%, and at 99%, it was 0.005%, and it has been proved that the magnetic field variation rate of the sample space was remarkably improved when the magnetization was more than 95% of the saturation magnetic flux density.

As has been described hereinabove, it has been proved that the uniform, polarized magnetic field device of the present invention is particularly advantageous when it is used as a uniform, polarized magnetic field generating device, such as a magnetic resonance device, which requires strong and uniform space magnetic field.

What is claimed is:

1. A magnetic field generating device for generating a uniform magnetic field in a space comprising:

a pole block of ferromagnetic material delimiting a sample space within said pole block configured for receiving a sample inserted through an insertion port of said pole block;

a yoke of magnetic material; and means for generating a magnetic field including first and second magnetic poles disposed between opposite ends of said pole block and said yoke, said pole block being fixedly secured to the first magnetic pole and spaced from the second magnetic pole to define a gap between said second magnetic pole and said pole block, said magnetic field generating means, said pole block and said yoke being coupled together to form a magnetic circuit for establishing a unidirectional magnetic field of uniform strength at least in an area of said sample space on which the sample lies.

2. A uniform magnetic field generating device according to claim 33 wherein said sample space has a contour of an ellipse base cylinder having a smaller diameter in the direction of magnetic field than the diameter in the transverse direction thereto.

3. A uniform magnetic field generating device according to claim 1, wherein said sample space is configured such that a center axis thereof is perpendicular to the direction of magnetic flux and the ratio of the area of the sample space in a plane normal to the direction of the magnetic flux at said center axis to the area of the pole block in said plane is not more than ⅓.

4. A uniform magnetic field generating device according to claim 2, said sample space is configured such that a center axis thereof is perpendicular to the direction of magnetic of flux and the ratio of the area of the sample space in a plane normal to the direction of the magnetic flux at said center axis to the area of the pole block in said plane is not more than ⅓.

5. A uniform magnetic field generating device according to claim 1, wherein said sample space is cylindrical about a center axis thereof lying at the center of said pole block.

6. A uniform magnetic field generating device according to claim 2, wherein said sample space is cylindrical about a center axis thereof lying at the center of said pole block.

7. A uniform magnetic field generating device according to claim 3, wherein said sample space is cylindrical about a center axis thereof lying at the center of said pole block.

8. A uniform magnetic field generating device according to claim 4, wherein said sample space is cylindrical about a center axis thereof lying at the center of said pole block.

9. A uniform magnetic field generating device according to claim 3 wherein said sample space is formed in at pole block at the minimum sectional area portion thereof located at the center between the magnet poles.

10. A uniform magnetic field generating device according to claim 2 wherein said sample space is formed in the pole block at the minimum sectional area portion thereof located at the center between the magnet poles.

11. A uniform magnetic field generating device according to claim 3 wherein said sample space is formed in the pole block at the minimum sectional area portion thereof located at the center between the magnet poles.

12. A uniform magnetic field generating device according to claim 4 wherein said sample space is formed in the pole block at the minimum sectional area portion thereof located at the center between the magnet poles.

13. A uniform magnetic field generating device according to claim 5 wherein said sample space is formed in the pole block at the minimum sectional area portion thereof located at the center between the magnet poles.

14. A uniform magnetic field generating device according to claim 6 wherein said sample space is formed in the pole block at the minimum sectional area portion thereof located at the center between the magnet poles.

15. A uniform magnetic field generating device according to claim 7 wherein said sample space is formed in the pole block at the minimum sectional area portion thereof located at the center between the magnet poles.

16. A uniform magnetic field generating device according to claim 8 wherein said sample space is formed in the pole block at the minimum sectional area portion thereof located at the center between the magnet poles.

17. A uniform magnetic field generating device according to claim 3 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

18. A uniform magnetic field generating device according to claim 2 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

19. A uniform magnetic field generating device according to claim 3 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

20. A uniform magnetic field generating device according to claim 4 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

21. A uniform magnetic field generating device according to claim 5 wherein said pole block is made of a magnetic material having a saturation magnetic flux density of more than 22 kG and magnetized to higher than 95% of the saturation magnetic flux density, whereby the magnetic flux variation rate of less than 0.01% is attained in the sample space.

22. A uniform magnetic field generating device according to claim 6 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

23. A uniform magnetic field generating device according to claim 7 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

24. A uniform magnetic field generating device according to claim 8 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

25. A uniform magnetic field generating device according to claim 8 wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

26. A uniform magnetic field generating device according to claim 9 wherein said pole block is made of a magnetic material having a saturation magnetic flux density of more than 22 kG and is magnetized to high than 95% of the saturation magnetic flux density, whereby the magnetic flux variation rate of less than 0.01% is attained in the sample space.

27. A uniform magnetic field generating device according to claim 11, wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

28. A uniform magnetic field generating device according to claim 12, wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

29. A uniform magnetic field generating device according to claim 13, wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

30. A uniform magnetic field generating device according to claim 14, wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

31. A uniform magnetic field generating device according to claim 15, wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

32. A uniform magnetic field generating device according to claim 16, wherein said pole block is made of a magnetic material having a saturation magnetic flux density of more than 22 kG and is magnetized to higher than 95% of the saturation magnetic flux density, whereby the magnetic flux variation rate of less than 0.01% is attained in the sample space.

33. A uniform magnetic field generating device according to claim 1 wherein the device forms a part of a nuclear magnetic resonance apparatus for magnetization of the sample inserted in said sample space.

* * * * *